United States Patent
Yokota et al.

(10) Patent No.: US 6,614,663 B1
(45) Date of Patent: Sep. 2, 2003

(54) REDUCING IMPEDANCE OF POWER SUPPLYING SYSTEM IN A CIRCUIT BOARD BY CONNECTING TWO POINTS IN ONE OF A POWER SUPPLY PATTERN AND A GROUND PATTERN BY A RESISTIVE MEMBER

(75) Inventors: Hitoshi Yokota, Kawasaki (JP); Tsutomu Hara, Fujisawa (JP); Mariko Kasai, Ebina (JP); Takashi Suga, Yokohama (JP); Hideo Sawada, Hadano (JP); Hiromu Ishihara, Hadano (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/361,232

(22) Filed: Jul. 27, 1999

(30) Foreign Application Priority Data

Jul. 29, 1998 (JP) .......................... 10-213572

(51) Int. Cl.$^7$ ................................ H05K 7/06
(52) U.S. Cl. .................. 361/780; 361/782; 361/794; 174/260; 174/261; 333/32; 333/33
(58) Field of Search .................. 361/760, 748, 361/752, 762–766, 818, 780, 782, 794, 777; 257/773, 774, 698, 691, 700, 701; 174/250, 260, 262, 266, 261, 255; 228/181.21, 181.22; 333/32, 33, 246, 247

(56) References Cited

U.S. PATENT DOCUMENTS

| | | | | |
|---|---|---|---|---|
| 4,922,059 A | * | 5/1990 | Walker et al. | 174/254 |
| 4,933,741 A | * | 6/1990 | Schroeder | 174/52.4 |
| 5,131,140 A | * | 7/1992 | Zimmer | 174/261 |
| 5,173,767 A | * | 12/1992 | Lange et al. | 257/664 |
| 5,185,651 A | * | 2/1993 | Boezen | 257/734 |
| 5,428,506 A | * | 6/1995 | Brown et al. | 361/794 |
| 5,491,301 A | * | 2/1996 | Akiba et al. | 174/250 |
| 5,543,727 A | * | 8/1996 | Bushard et al. | 324/760 |
| 5,587,887 A | * | 12/1996 | Price et al. | 174/260 |
| 5,639,989 A | * | 6/1997 | Higgins, III | 174/35 MS |
| 5,663,870 A | * | 9/1997 | Kerndlmaier | 361/763 |
| 5,898,576 A | * | 4/1999 | Lockwood et al. | 361/782 |
| 5,926,377 A | * | 7/1999 | Nakao et al. | 361/763 |
| 5,966,294 A | * | 10/1999 | Harada et al. | 174/250 |
| 6,075,423 A | * | 6/2000 | Saunders | 333/33 |

FOREIGN PATENT DOCUMENTS

| | | |
|---|---|---|
| JP | 8-64984 | 3/1996 |
| JP | 9-246681 | 9/1997 |

* cited by examiner

*Primary Examiner*—John B. Vigushin
(74) *Attorney, Agent, or Firm*—Mattingly, Stanger & Malur, P.C.

(57) ABSTRACT

In a circuit board having a multilayer structure comprising a ground pattern and a power-supply pattern both, for example, by forming a plurality of slits along each side of the ground pattern or the power-supply pattern, a long thin conduction path connecting a corner and a side center of the ground pattern is formed and resistive elements are placed in the middles of the conduction path to short, circuit the corner and a side center of the ground pattern. Therefore, portions corresponding to an antinode and a node or antinode and an antinode of a standing wave are short-circuited. The standing wave is generated when electric power is supplied to ICs and LSIs mounted on the circuit board. Thus, noise sources caused by the standing wave cancel each other. As a result, the occurrence of an antiresonance phenomenon and an increase in impedance of the power supplying system caused by the standing wave can be suppressed.

11 Claims, 9 Drawing Sheets

EQUIVALENT CIRCUIT OF A POWER-SUPPLY OR
GROUND LAYER IN A 1/2-WAVELENGTH MODE

SIMPLIFIED DIAGRAM SHOWING A CONFIGURATION WITH
A CABLE CONNECTED TO THE ELECTRONIC CIRCUIT

EQUIVALENT CIRCUIT OF THE GROUND WITH A CABLE CONNECTED TO THE ELECTRONIC CIRCUIT

REDUCING IMPEDANCE OF POWER SUPPLYING SYSTEM IN A CIRCUIT BOARD BY CONNECTING TWO POINTS IN ONE OF A POWER SUPPLY PATTERN AND A GROUND PATTERN BY A RESISTIVE MEMBER

BACKGROUND OF THE INVENTION

1. Field of the Invention

This invention relates to a technology and a circuit board for reducing the impedance of a power supplying system of the circuit board as well as an electronic apparatus adopting the technology and employing the circuit board. More particularly, the present invention relates to a technology suitable for reducing the impedance of a power supplying system and the amount of radiated noise (emission noise).

2. Description of the Prior Art

An electronic circuit operates by supplying a voltage and a current from a power supply. In the following description wiring connecting the power supply and the electronic circuit is referred to as a power supplying system. Let the voltage supplied by the power supply be denoted by V an operating current of the electronic circuit be denoted by ic, the internal impedance of the power supply be denoted by Zp and the impedance of the power supplying system other than the internal impedance Zp be denoted by Z1 as shown in FIG. 8. In this case a voltage Vc actually applied to the electronic circuit is expressed by Eq. (1) as follows:

$$Vc = V - ic((Zp + Z1)) \quad (1)$$

If the product of the operating current ic and the sum of the impedances Zp and Z1 is large, the actually applied voltage Vc drops, causing the electronic circuit not to operate normally. The product of the operating current ic and the sum of the impedances Zp and Z1 is referred to as a power-supply voltage drop. For a fixed operating current ic, it is necessary to reduce the sum of the impedances Zp and Z1 shown in Eq. (1) in order to make the power-supply voltage drop small. In order to reduce the sum of the impedances Zp and Z1, it is necessary to decrease the impedance Zp of the power-supply circuit and the impedance Z1 of the wiring of the power supplying system.

There are three implementable methods of reducing the impedance of the power supplying system. According to the first method, the area of the cross section of the wire of the power supplying system is increased. In the second method, the power supply is placed at a location close to the ground. According to the third method, the length of the entire power supplying system, that is, the wiring, is reduced. As a combination of the three methods there is known a conventional method wherein a, bypass capacitor is implemented on a multilayer circuit board at a location in close proximity to the electronic circuit as shown in FIG. 9. The multilayer circuit board includes a plane power-supply layer and a plane ground layer. Since the power-supply and round layers are made plane the areas of the cross sections are large and the power-supply and ground layers can be placed at locations close to each other in a parallel orientation. As a result the inductance can be reduced. In addition by implementing the bypass capacitor at a location in close proximity to the electronic circuit the bypass capacitor plays a substitutive role of the power supply that corresponds to a high-speed power-supply current and thereby the power supply becomes a short distance from the electronic circuit. Thus these effects allow the impedance of the power supplying system to be reduced.

By using a multilayer circuit board the impedance of the power supplying system can be reduced as described above. In addition, by interfacing the power-supply layer with the ground layer over a wide area the power supply system (the multilayer circuit board) exhibits a behavior of a distributed constant circuit in a high-frequency zone. Thus, noise generated at a point on the power-supply layer propagates through the power-supply and ground layers, being reflected at the ends of the board. The reflection of the noise at the ends of the board is repeated, resulting in a standing wave on the power-supply and around layers. In turn, this standing wave raises a technical problem of a seemingly increased impedance of the power supplying system. This appearance of the standing wave is referred to as a parallel resonance, phenomenon or an antiresonance phenomenon. FIG. 10 is a diagram showing the state of the standing wave. With a standing wave generated as described above, the power-supply and ground layer are equivalent to a noise source 907a connected to a noise source 907b in series as shown in FIG. 11.

Methods for solving this technical problem include a technique of providing a termination at each edge of the board as is disclosed in Japanese Patent Laid-Open No. Hei 8-64984 and a technique of forming the board into a hexagonal shape as is disclosed in Japanese Patent Laid-Open No. Hei 9-246681 to make resonance difficult to occur. With the former method disclosed in Japanese Patent Laid-Open No. Hei 8-64984 however, the layer structure of the board becomes complicated, raising a technical problem of an increased price of the board. As for the latter method disclosed in Japanese Patent Laid-Open No. Hei 9-246681, there is raised a technical problem of lower wiring and implementation efficiencies.

In addition, the resonance of the power-supply and ground layers causes the following technical problem. If a signal cable is connected to the circuit board as shown in FIG. 12 the ground can be represented by an equivalent circuit shown in FIG. 13. As shown in the figure the series circuit comprising the noise source 907a and the noise source 907b is connected to a ground line 906 of the cable. The noise source 907a and the noise source 907b excite the ground line 906 to work as a dipole antenna, generating an EMI a kind of undesired electromagnetic radiation. In particular if an antiresonance phenomenon occurs a standing wave generated on the ground layer serves as these noise sources raising a concern about generation of a large EMI.

SUMMARY OF THE INVENTION

It is thus an object of the present invention to provide a technology capable of suppressing an increase in impedance of a power supplying system caused by typically an antiresonance phenomenon occurring in a circuit board with a simple structure.

It is another object of the present invention to provide a technology capable of implementing a stable operation of each device mounted on a circuit board and reduction of power consumption by stabilizing a voltage supplied by a power supplying system.

It is still another object of the present invention to provide a technology capable of suppressing the amount of noise radiated (emmission noise, EMI) from typically a cable connected to a circuit board.

According to a method for reducing the impedance of a power supplying system provided by the present invention, on a circuit board including a power-supply pattern and a ground pattern two different points of the same power-supply pattern or two different points of the same ground pattern are connected by a circuit structure including a resistive member (resistance region).

In addition, a circuit board provided by the present invention is provided with a circuit structure including a conduction path with both ends thereof connected to two different points of the same power-supply pattern or two different points of the same ground pattern and a resistive member (resistance region) provided on a portion of the conduction path.

Furthermore, a circuit board provided by the present invention is provided with a circuit structure including a conduction path with both ends thereof connected to two different points of the same power-supply pattern or two different points of the same round pattern and a resistive member (resistance region) provided on a portion of the conduction path wherein at least one of the two points coincides approximately with a location on a side of the power-supply pattern or the ground pattern at a distance of 1/n of the length of the side from an end of the side where n is an integer.

In addition the circuit board provided by the present invention includes a conduction pattern for supplying electric power at least one slit formed on a portion of the conduction pattern and a resistive member (resistance region) provided in a conduction area sandwiched by an external edge of the conduction pattern and the slit or resistive elements (resistance region) in conduction areas among a plurality of slits.

Figure 10:
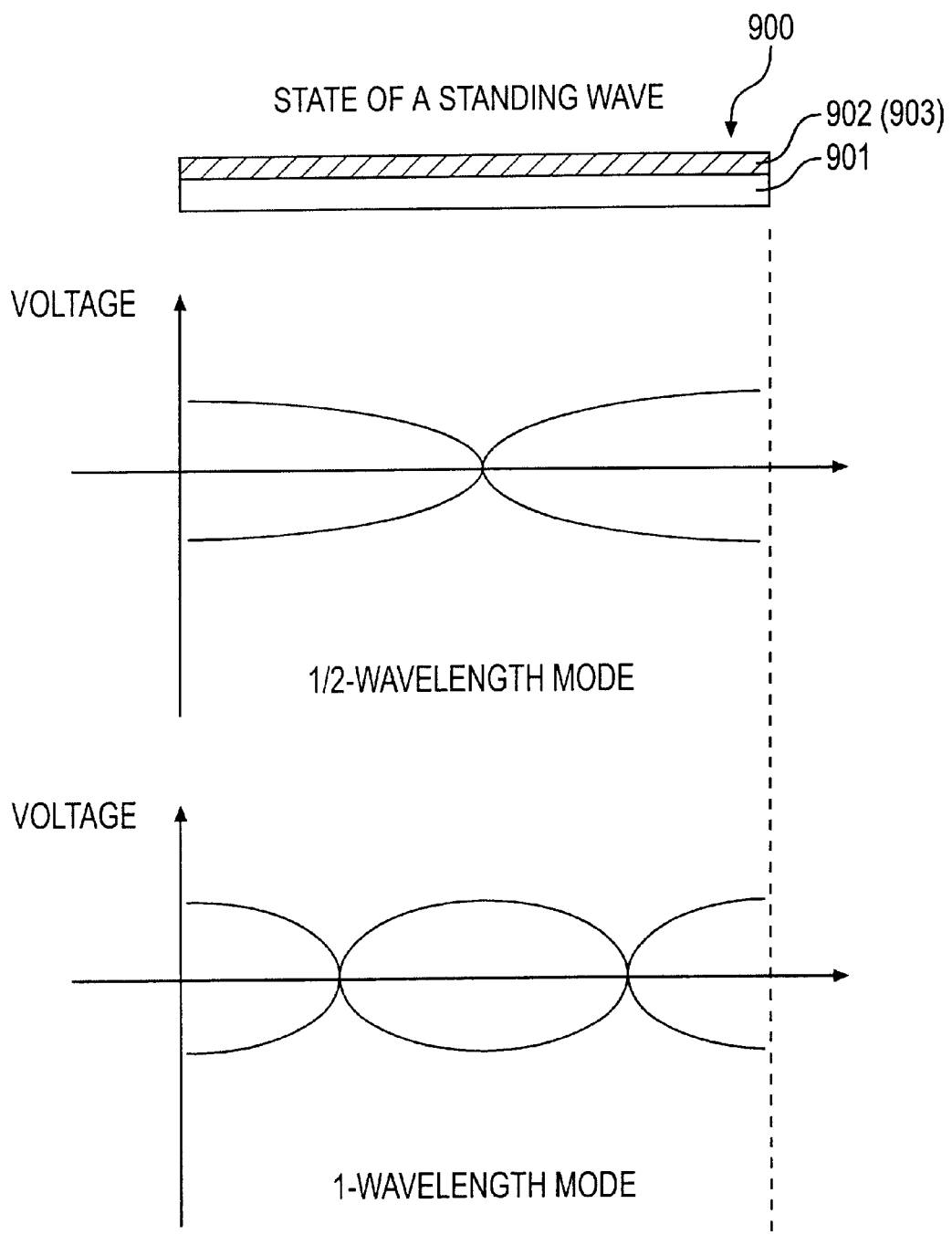
FIG. 10 is diagrams showing a typical state of a standing wave generated typically on a ground pattern of a multilayer circuit board.
Figure 11:
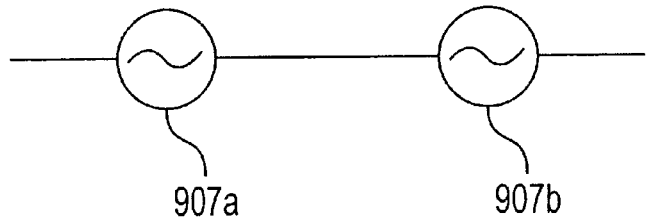
FIG. 11 is a diagram showing a typical equivalent circuit of a source of noise generated in a power supply or a ground layer of a multilayer circuit board.
Figure 12:
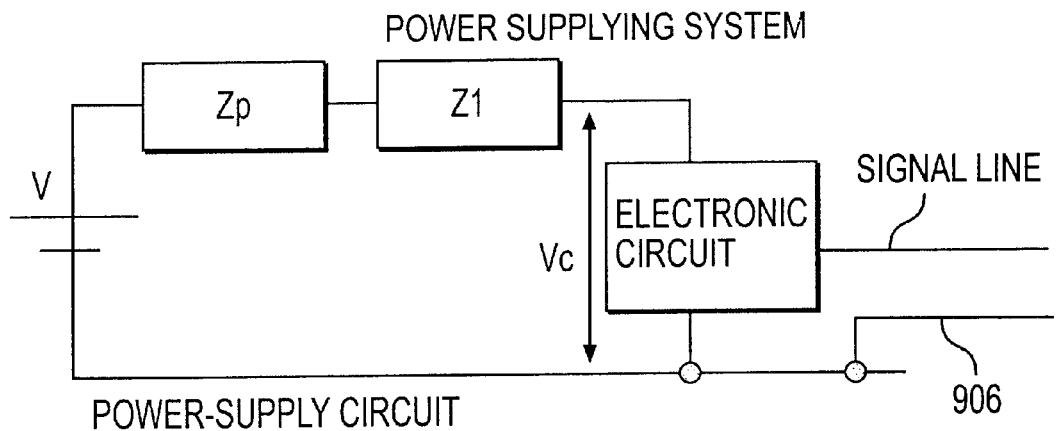
FIG. 12 is a diagram showing a typical equivalent circuit used for explaining a state of generation of noise for a case in which a signal cable is connected to a multilayer circuit board.
Figure 13:
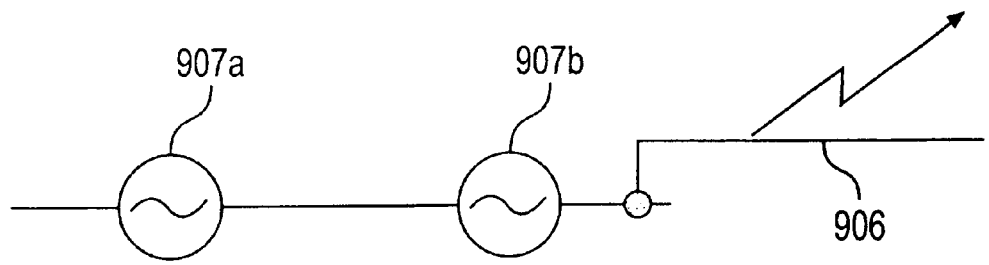
FIG. 13 is a diagram showing a typical equivalent circuit used for explaining a state of generation of noise for a case in which a signal cable is connected to a ground pattern of a multilayer circuit board.

FIG. 10 is diagrams showing the state of a standing wave generated on a board 900 in which a power-supply layer 902 and a ground layer 903 are created on an insulation layer 901 to form a plane shape. In both a 1/2-wavelength mode and a 1-wavelength mode the edges of the board 900 each become an antinode (abdomen). This state is represented by an equivalent circuit shown in FIG. 11. An equivalent power supply (noise source) 907a and an equivalent power supply (noise source) 907b are formed on the power-supply layer 902 and the ground layer 903 of the board 900.

In this present invention two points of the power-supply layer 902 or the ground layer 903 corresponding to the portions (locations dividing each side of the board into n segments) of the antinodes (abdomens) (the equivalent power supplies 907a and 907b) of a standing wave generated on the board 900 are short-circuited by a redundant circuit as described above.

Figure 14:
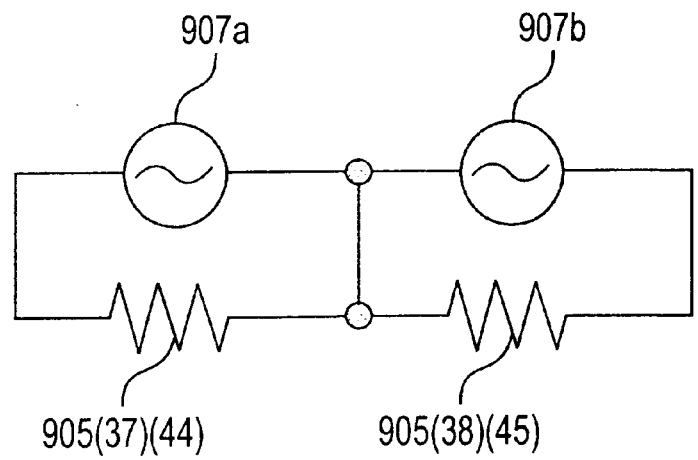
FIG. 14 is a diagram showing a typical equivalent circuit used for explaining an effect of a case in which a ground pattern or a power-supply pattern of a circuit board provided by the present invention is short-circuited.

That is to say by short-circuiting both ends of the equivalent power supply 907a and both ends of the equivalent power supply 907b, the equivalent power supply 907a and the equivalent power supply 907b cancel each other, and the occurrence of an antiresonance phenomenon is suppressed. However even if the ends are short-circuited with no resistance, in this case, the resonance frequency is just shifted to another frequency. In order to solve this problem, the ends of the equivalent power supply 907a and the ends of the equivalent power supply 907b are short circuited by using resistors 905 as shown in FIG. 14.

DETAILED DESCRIPTION OF PREFERRED EMBODIMENTS

Preferred embodiments of the present invention are explained by referring to diagrams as follows.

1. First Embodiment

Figure 1:
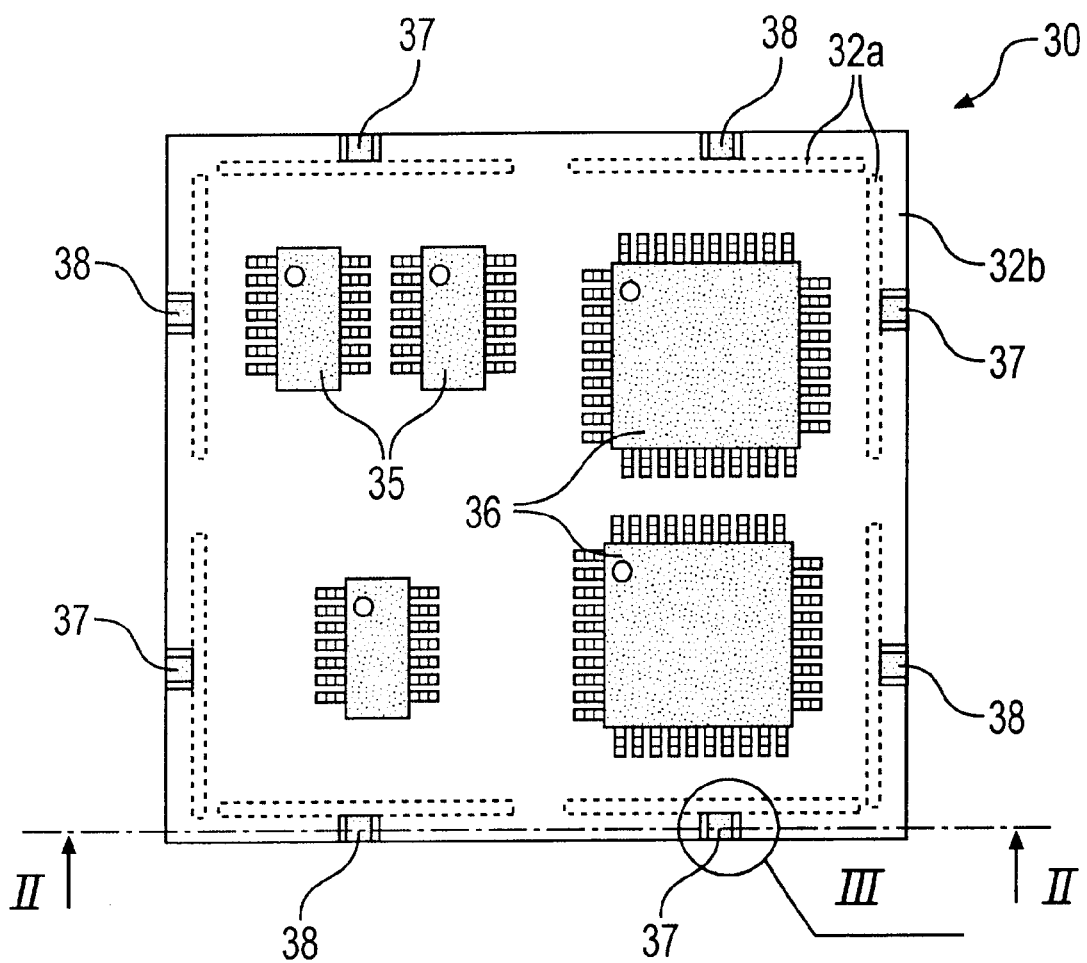
FIG. 1 is a diagram showing the top view of a typical configuration of a circuit board implementing a method of reducing the impedance of a power supplying system provided by the present invention.
Figure 2:
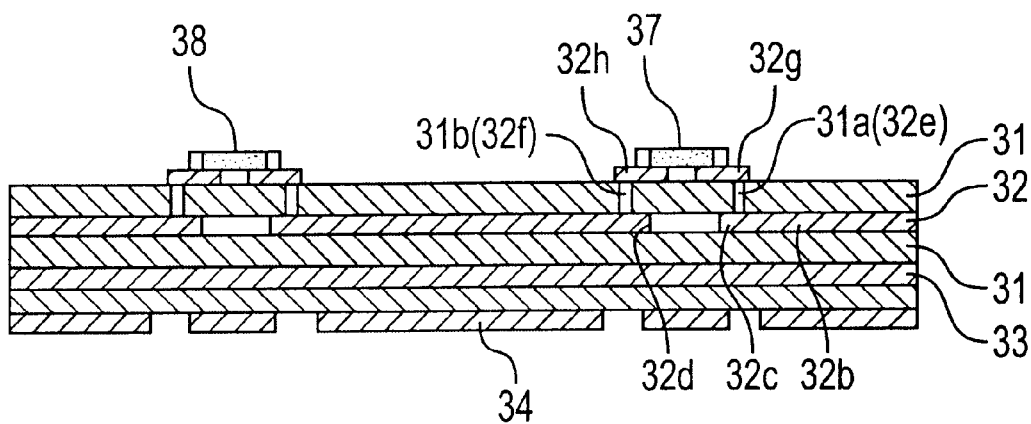
FIG. 2 is a diagram showing the cross section of a portion indicated by a II—II line in FIG. 1.
Figure 3:
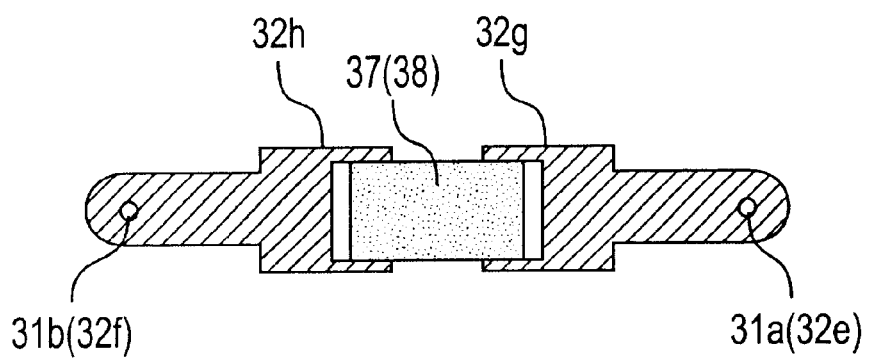
FIG. 3 is a diagram showing an enlarged III portion shown in FIG. 1.

FIG. 1 is a diagram showing the top view of a typical configuration of a circuit board implementing a method of reducing the impedance of a power supplying system provided by the present invention. FIG. 2 is a diagram showing the cross section of a portion indicated by a line II—II in FIG. 1. FIG. 3 is a diagram showing an enlarged portion III shown in FIG. 1.

In the embodiment, different points on a ground pattern or a power-supply pattern composing a circuit board 30 are short-circuited to suppress the occurrence of an antiresonance phenomenon.

The circuit board implemented by the embodiment has a multilayer structure of a ground pattern 32 a power-supply pattern 33 and a wiring pattern 34 which are stacked on each other through a plurality of insulation layers 31. The ground pattern 32 and the power-supply pattern 33 constitute a power supplying system. The ground pattern 32 the power-supply pattern 33 and the wiring pattern 34 are each made of typically metallic foil or a plating material.

On the top insulation layer 31 a plurality of components such as ICs 35 and LSIs 36 are mounted. The components are connected to the ground pattern 32 and the power-supply pattern 33 for supplying electric power required for their operations thereto by wiring patterns drawn around, leading to the insulation layer 31 and by through holes and via holes bored through the circuit board 30 in the thickness direction of the circuit board 30. In addition the components are also connected to the wiring pattern 34 so that signals can be exchanged by way of the wiring pattern 34 in order to carry out predetermined operations.

Figure 4:
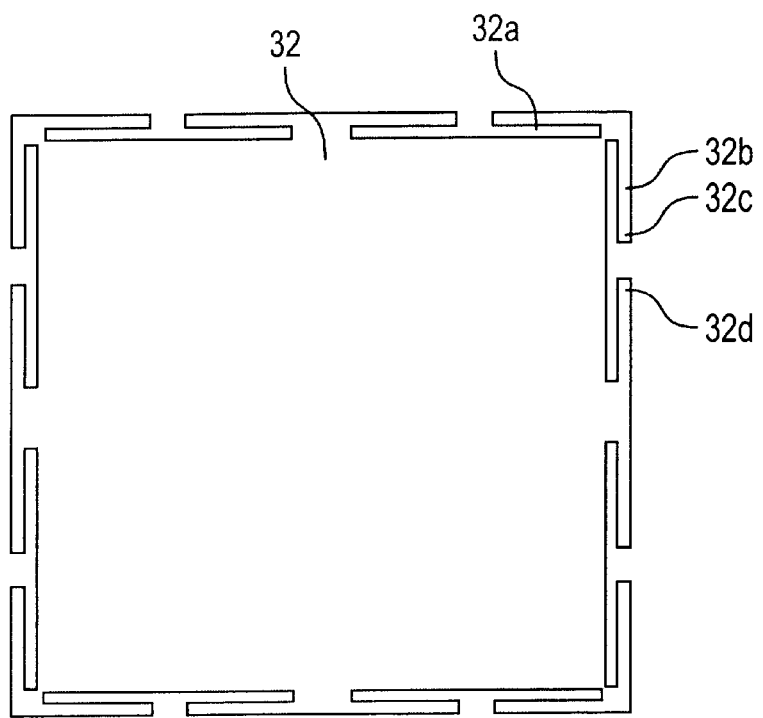
FIG. 4 is a diagram showing a top view of a ground pattern removed from a circuit board adopting the method of reducing the impedance of a power supplying system provided by the present invention.

In the case of this embodiment, a plurality of slits 32a are formed around the ground pattern 32 along each side of the ground pattern 32 as shown in FIG. 4. The slits 32a divide each side into almost equal halves. A long and narrow conduction path 32b is sandwiched by a slit 32a and the outer edge of the ground pattern 32. The ends of the conduction path 32b are connected to a corner and a side center of the ground pattern 32. The center of the conduction path 32b is cut to result in cut ends 32c and 32d.

It should be noted that a slit 32a is provided in this embodiment to electrically isolate the conduction path 32b from other areas of the round pattern 32. Thus, a thin and long nonconductive portion created on part of the ground pattern 32 is included in the slit concept in addition to creation of a physical cut on the ground pattern 32.

In addition, via holes 31a and 31b are bored through the insulation layer 31 right above the cut ends 32c and 32d respectively as shown in FIG. 2. Connecting conductors 32e and 32f are formed inside the via holes 31a and 31b respectively by using typically a plating technique. The bottom ends of the connecting conductors 32e and 32f are connected to the cut ends 32c and 32d respectively. On the other hand, the top ends of the connecting conductors 32e and 32f are connected to resistive elements 37 and 38 through wiring patterns 32g and 32h respectively which are formed on the top insulation layer 31.

The corner and the side center of the ground pattern 32, that is, the antinode (abdomen) and the node (section) of a standing wave shown in FIG. 10, are put in a short-circuited state by the thin long conduction path 32b formed by the existence of a slit 32a the connecting conductors 32e and 32f the wiring patterns 32g and 32h and the resistive elements 37 and 38 to form a circuit configuration of an equivalent circuit shown in FIG. 14.

In such a circuit configuration the antinode and the node of a standing wave generated on the ground layer (the ground pattern 32) are short-circuited by the resistive elements 37 and 38 which consume electric energy of the standing wave. converting the energy into heat. As a result reduction of the impedance of the power supplying system comprising the ground pattern 32 and the power-supply pattern 33 and reduction of the magnitude of an EMI generated by typically a cable (not shown in the figure) connected to the circuit board 30 can be implemented.

As described above, in this embodiment the conduction path 32b is formed between a slit 32a and the outer edge of the ground pattern 32. It should be noted, however that a long thin conduction path can also be formed between 2 formed parallel slits.

In addition the configurations shown in FIGS. 1 to 3 each exemplify a case in which, by creating a slit 32a on the ground pattern 32, a portion of the ground pattern 32 is used as a conduction path. It is worth noting that a short-circuiting circuit can also be provided independently of the ground pattern 32.

Figure 5:
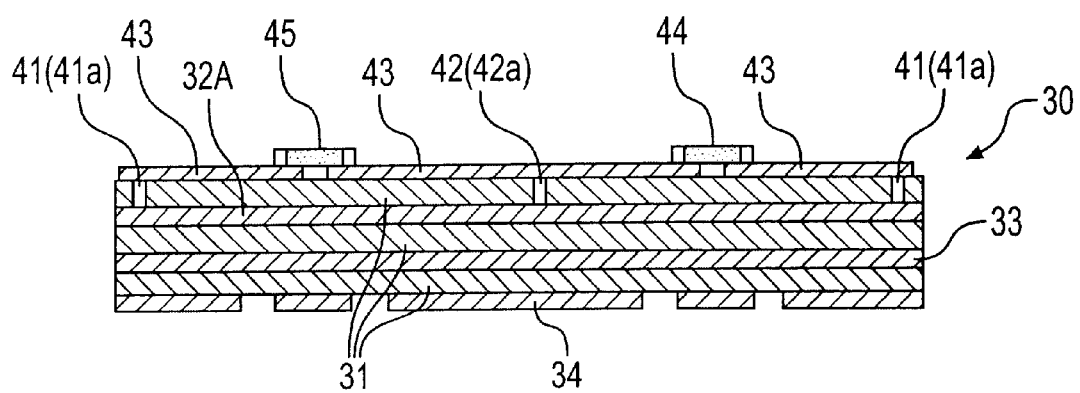
FIG. 5 is a diagram showing a cross section of a modified version implementing short circuiting of a ground pattern of a circuit board adopting the method of reducing the impedance of a power supplying system provided by the present invention.

To put it in detail, via holes 41 and 42 are bored through the insulation layer 31 at the corner and the center of each side of the ordinary plane ground pattern 32A as shown in FIG. 5. Connecting conductors 41a and 42a with the bottom ends thereof connected to the ground pattern 32A are further created inside the via holes 41 and 42 respectively. In addition a wiring pattern 43 is created on the top insulation layer 31, being drawn along each side of the insulation layer 31. The ends of the wiring pattern 43 are connected to the top ends of the connecting conductors 41a and 42a created inside the via holes 41 and 42 respectively. By connecting cut ends of the wiring pattern 43 to the two ends of a resistive element 44 and two ends of a resistive element 45, the corner and the side center of the ground pattern 32A, that is, the antinode and the node of a standing wave shown in FIG. 10, are put in a short-circuited state by the connecting conductors 41a and 42a the wiring pattern 43 and the resistive elements 44 and 45.

In the case of the embodiment shown in FIG. 5 by merely forming and positioning the via hole 41 and the connecting conductor 41a as well as the via hole 42 and the connecting conductor 42a and by merely drawing the wiring pattern 43 without changing the shape of the ground pattern 32A at all any two points on the ground pattern 32A can be short-circuited by the resistive elements 44 and 45, offering a merit of increased freedom to set short-circuited locations. The via hole 41 and the connecting conductor 41a as well as the via hole 42 and the connecting conductor 42a created along with the wiring pattern 43 and the resistive elements 44 are positioned at such locations on an existing circuit pattern 30 to eliminate a standing wave of the circuit pattern 30 or a standing wave the distribution of which could not be predicted at the design stage of the circuit board 30. Thus the occurrence of an antiresonance phenomenon due to such a standing wave are suppressed. As a result reduction of the impedance of the power supplying system and reduction of the magnitude of an EMI generated by typically a cable connected to the circuit board 30 are implemented. It should be noted that the cable itself is not shown in the figure.

Figure 6:
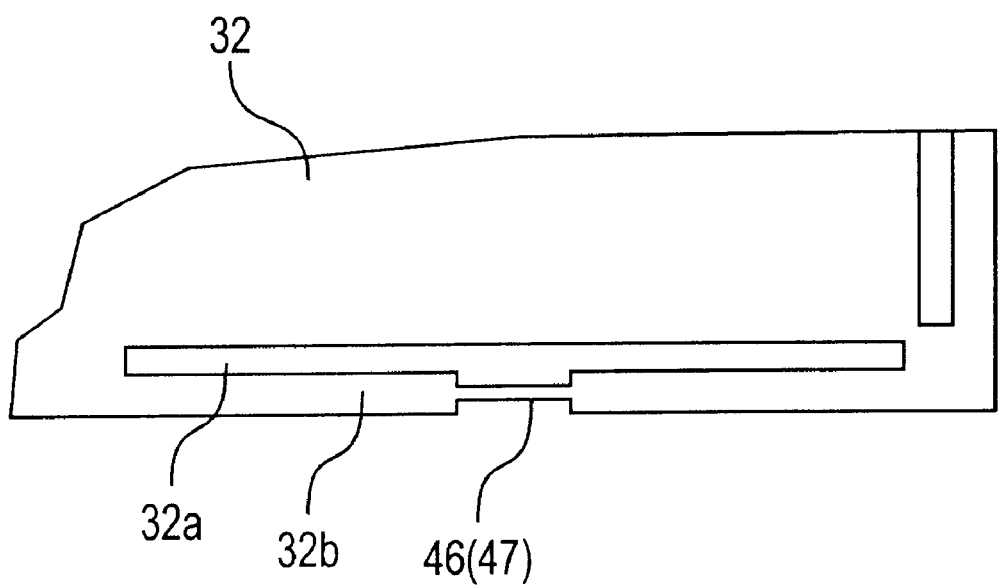
FIG. 6 is a diagram showing a top view of a modified version implementing a ground pattern of a circuit board adopting the method of reducing the impedance of a power supplying system provided by the present invention.

FIGS. 1 to 5 each show a case in which separate resistive elements are formed on a short-circuited path. It should be noted that a changed-shape portion (a bound part) 46 or a changed-property portion (a reformed part) 47 having a selective high resistance can be formed on a portion of the long thin conduction path 32b as shown in FIG. 6 in place of a resistive element. In this case the resistive elements of a separate body are not required, resulting merits such as a small size and a low cost due to a simple structure.

2. Second Embodiment

Figure 7:
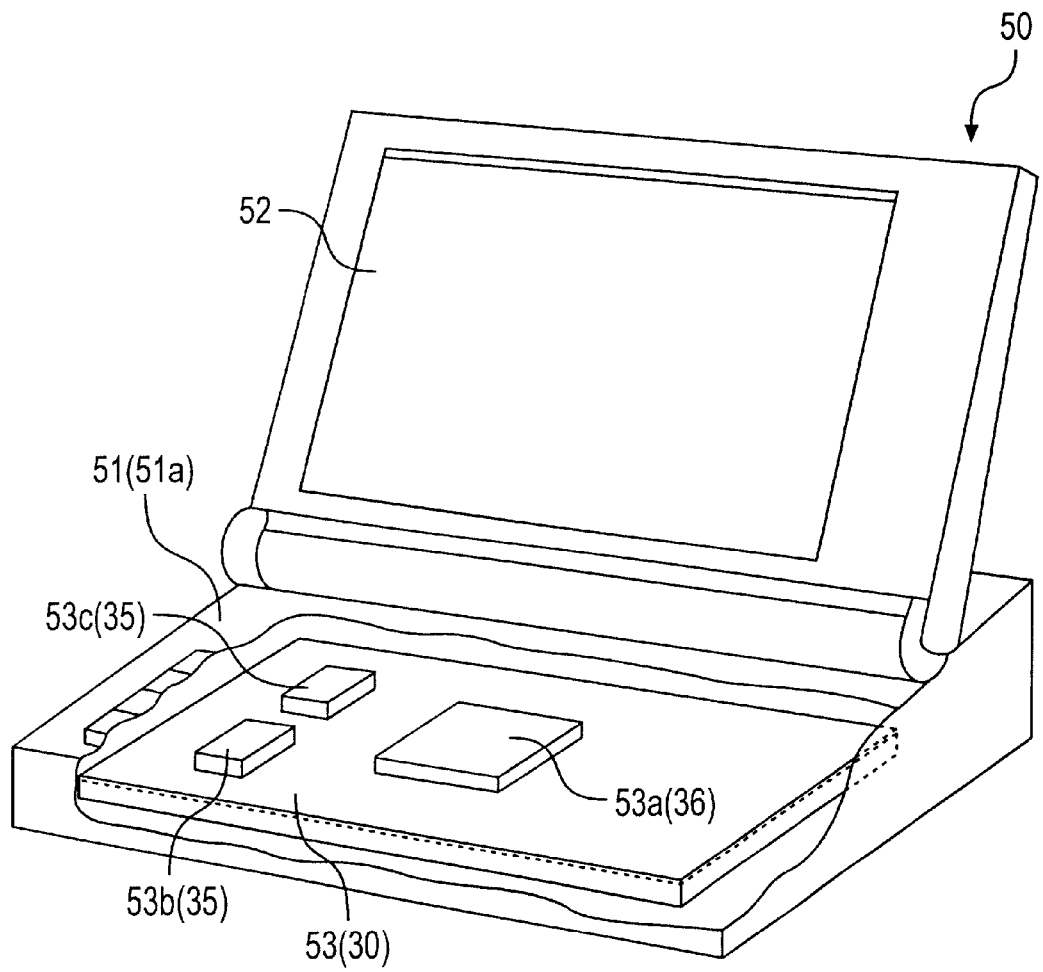
FIG. 7 a diagram showing a partial cross section of an open typical configuration of an electronic apparatus implemented by an embodiment of the present invention.
Figure 8:
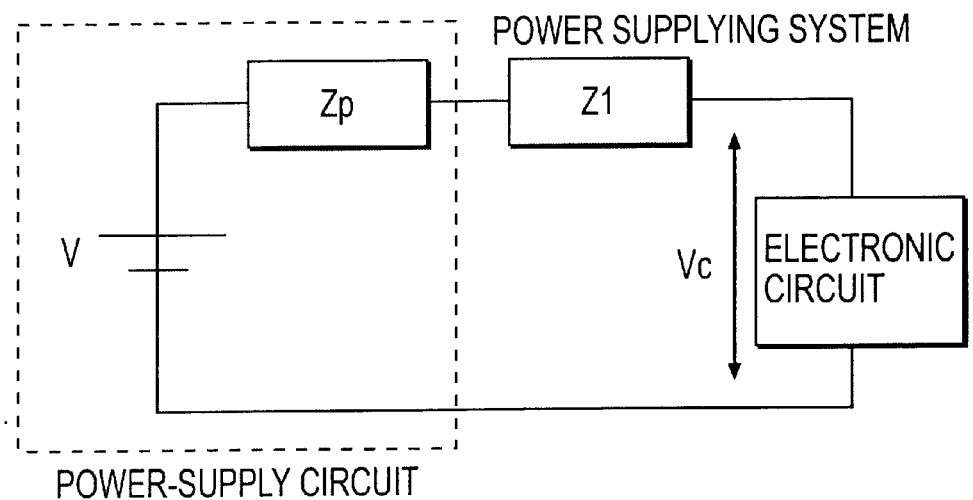
FIG. 8 is diagram showing a typical equivalent circuit used for explaining an impedance of a power supplying system based on a reference technology of the present invention.
Figure 9:
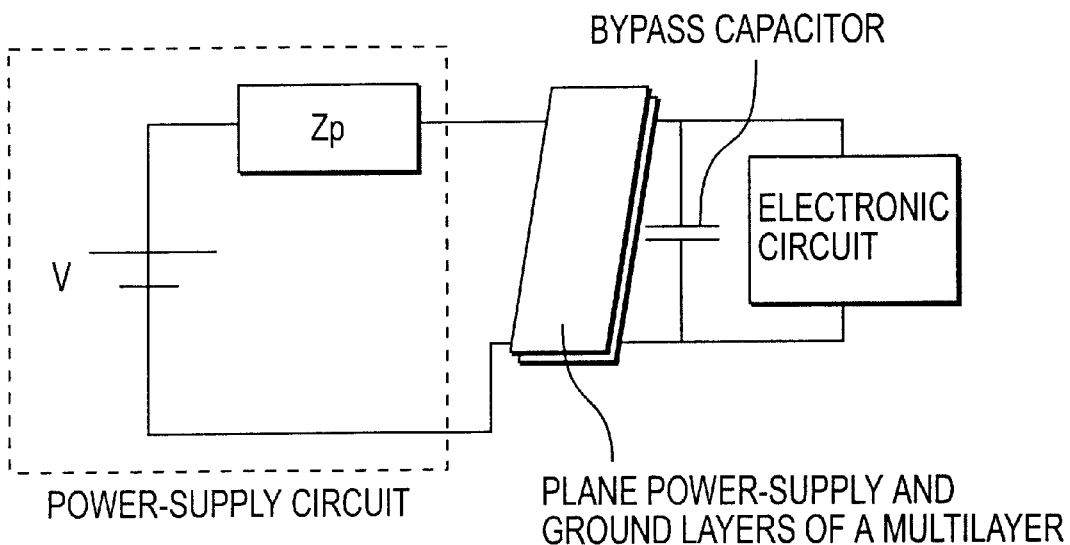
FIG. 9 is a diagram showing a typical equivalent circuit of a case employing a bypass capacitor for reducing the impedance of a power supplying system on a multilayer circuit board.

FIG. 7 is a diagram showing a partial cross section of an open typical configuration of an electronic apparatus implemented by an embodiment of the present invention.

An example of the electronic apparatus implemented by the embodiment is an information processing apparatus 50 such as a portable personal computer. The information processing apparatus 50 implemented by the embodiment comprises a cabinet (a case) 51 equipped with a keyboard 51a and a display unit 52 such as a liquid-crystal display device that can be foldaway into the cabinet (case) 51 with a high degree of freedom.

Inside the cabinet 51, there is incorporated a circuit board 55 such as a mother board on which components such as a general-purpose microprocessor 53*a*, a semiconductor memory device 53*b* and an input/output control device 53*c* are mounted. The circuit board 53 is implemented by the circuit board 30 shown in FIG. 1. Thus, the occurrence of an antiresonance phenomenon due to sources such as a standing wave can be suppressed. As a result reduction of the impedance of the power supplying system and reduction of the magnitude of an EMI generated by typically a cable connected to the circuit board 30 are implemented.

Effects are therefore, among other things, a long operating time due to reduction of electric-power consumption obtained as a result of reduction of the impedance of the power supplying system cost reduction due to reduction of the rated capacity of a power-supply circuit not shown in the figure and suppression of the generation of noise caused by typically an EMI. As a result there is improved performance of the information processing apparatus 50.

The inventions by the inventors have been described in concrete terms by using embodiments as examples. It should be noted however that the scope of the present invention is not limited to the embodiments. It is needless to say that a variety of changes in a range not deviating from the essentials of the invention can be made to the embodiments.

In the description given above an electronic apparatus is exemplified by an information processing apparatus employing components such as semiconductor devices. It should be noted however that the scope of the present invention is not limited to this example. For example, the present invention can also be applied to a broad range of applications including mobile communication apparatuses such as a portable telephone.

According to the invention there is obtained an effect to suppress an increase in impedance of the power supplying system caused by typically an antiresonance phenomenon occurring on the circuit board through a simple structure.

In addition, according to the invention there is also obtained an effect to implement a stable operation of each device mounted on the circuit board and reduction of power consumption by stabilizing a voltage supplied by a power supplying system.

Furthermore, according to the invention, there is also obtained an effect to suppress the amount of noise (emission noise. EMI) radiated by typically a cable connected to the circuit board.

What is claimed is:

1. A circuit board for reducing an impedance of a power supplying system in a multilayer board including a power-supply layer and a ground layer, comprising:

a conduction path with both ends thereof connected to two discrete points of which voltages are different on a continuous layer which is one of the power-supply layer and the ground layer, and a resistive member connected to a portion of said conduction path.

2. A circuit board according to claim 1, said conduction path is isolated from the layer on which the two points are connected.

3. A circuit board according to claim 1, wherein at least one of said two points coincides with a location on a side of one of said power-supply layer and said ground layer at a distance of 1/n of a length of said side from an end of said side, where n is an integer.

4. A circuit board according to claim 1, wherein said resistive member is a resistive element separated from said conduction path.

5. A circuit board according to claim 1, wherein said resistive element is formed by changing one of the shape or by changing material property of said conduction path.

6. A method for reducing the impedance of a power supplying system in a circuit board including a power-supply layer and a ground layer, comprising the steps of:

selecting two different discrete points of which voltages are different on a continuous layer which is one of the power-supply layer and the ground layer, and connecting said two different points by a circuit structure including a conductive path and a resistive member.

7. A method for reducing an impedance of a power supplying system in a circuit board according to claim 6, said circuit structure being isolated from the layer on which the two points are connected.

8. A circuit board comprising:

a continuous conduction layer for supplying electric power on a layer, at least one slit formed on a portion of said layer and a resistive member separated from the continuous conduction layer by said slit and connecting two discrete points of the continuous conducting layer.

9. An electronic apparatus comprising:

a circuit board including a power-supply layer, a ground layer, a conduction path with both ends thereof connected to two discrete points on a same continuous layer which is one of the power-supply layer and the ground layer, and a resistive member connected to a portion of said conduction path:

a chip mounted to said circuit board:

a display unit: and a cabinet holding said circuit board, said chip, and said display unit.

10. A circuit board having a multilayer structure including a ground layer and a power-supply layer, comprising;

an isolation element formed along a side of the layer which is one of the ground layer and the power supply layer, whereby a conduction path connecting a corner and a side center of a same layer which is one of the ground layer and the power-supply layer is formed, and a resistive element put in said conduction path to short-circuit the corner and the side center.

11. A circuit board according to claim 10 said isolation element is a plurality of slits formed along a side of the layer which is one of the ground layer and the power-supply layer.

* * * * *